United States Patent [19]

Steinmüller

[11] 4,378,524

[45] Mar. 29, 1983

[54] ELECTRONIC THREE-PHASE WATT-HOUR METER

[75] Inventor: Günter Steinmüller, Nuremberg, Fed. Rep. of Germany

[73] Assignee: Siemens Aktiengesellschaft, Munich, Fed. Rep. of Germany

[21] Appl. No.: 184,469

[22] Filed: Sep. 5, 1980

[30] Foreign Application Priority Data

Sep. 21, 1979 [DE] Fed. Rep. of Germany ....... 2938238

[51] Int. Cl.³ .................... G01R 21/06; G01R 11/16
[52] U.S. Cl. .................................. 324/107; 324/142
[58] Field of Search ............... 324/142, 107, 141, 120, 324/111

[56] References Cited

U.S. PATENT DOCUMENTS 3,953,795  4/1976  Brunner et al. ............... 324/142
4,217,545  8/1980  Kusui et al. ................... 324/142

OTHER PUBLICATIONS

Graeme et al.; Operational Amplifiers-Design & App.; 1971; McGraw-Hill Book Co., N.Y., N.Y.; p. 274.

Primary Examiner—Ernest F. Karlsen
Attorney, Agent, or Firm—Kenyon & Kenyon

[57] ABSTRACT

An electronic multiphase watt-hour metering system containing time-division multiplying circuitry. A duty cycle modulator and a switching device are provided for each phase of interest, the output signals of which are combined and conducted to a current-to-frequency converter. The output frequency of the current-to-frequency converter is responsive to the rate of electrical power consumption from a multiphase transmission system. In one embodiment, the current-to-frequency converter is coupled at its output to an accumulating counting system for recording the total energy supplied to a load. There may further be provided an indicator responsive to the frequency of the current-to-frequency converter for providing a visual indication of the instantaneous rate of power usage.

8 Claims, 4 Drawing Figures

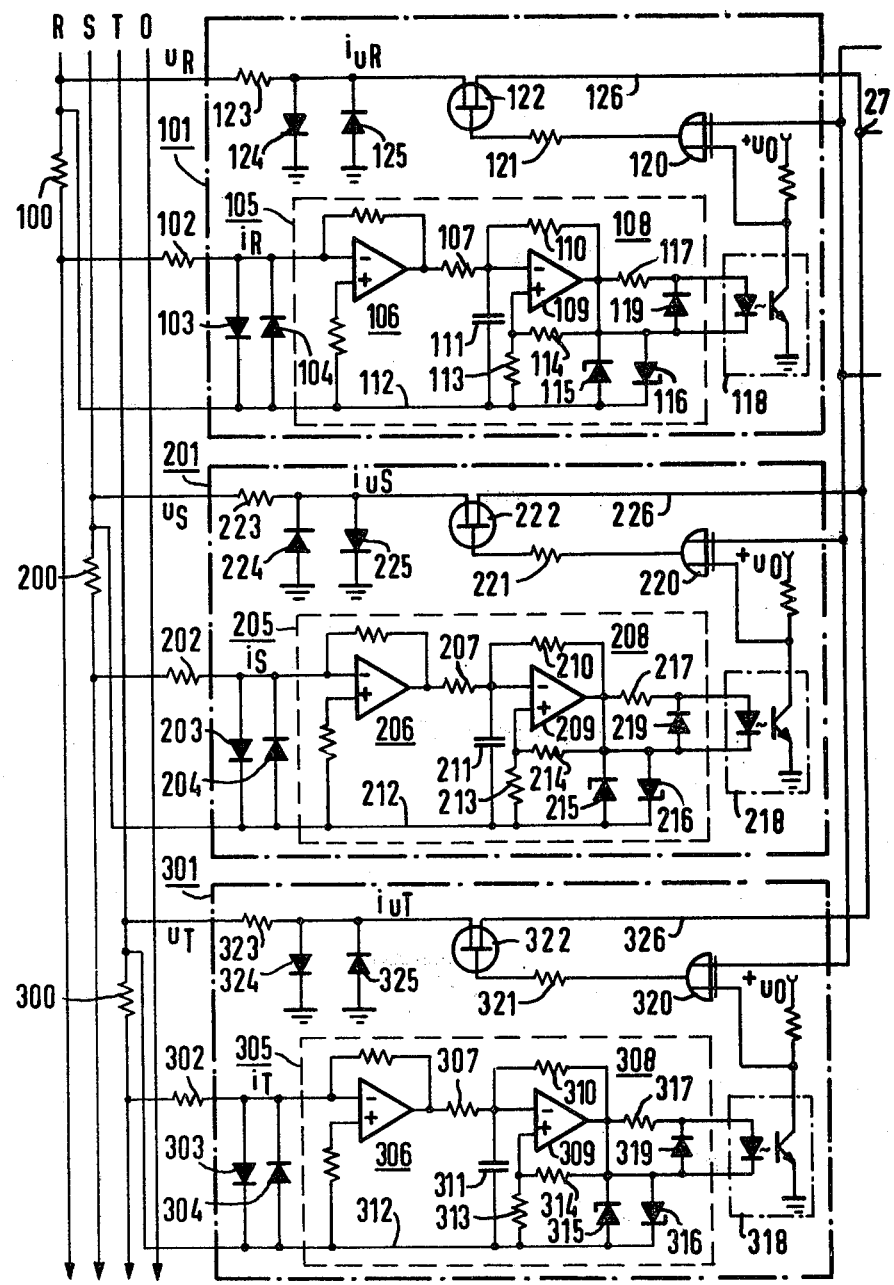

ELECTRONIC THREE-PHASE WATT-HOUR METER

BACKGROUND OF THE INVENTION

This invention relates generally to systems for measuring electrical energy consumption from a transmission system, and more particularly to an electronic system for measuring electrical energy consumption from a three-phase transmission system.

A commercially available electronic watt-hour meter which is used for measuring the consumption of electrical energy from a single phase alternating current transmission system is described in German Patent DE-OS No. 27 47 385. The system described therein receives an electrical signal which corresponds to the load current of the system for controlling a duty cycle modulator. The output signal of the duty cycle modulator is applied through logic circuitry to an analog control switch which controls the conduction of a second input signal which corresponds to the load voltage. The analog switch, however, is shunted by complex amplification circuitry so as to produce a signal which corresponds to a preselected fraction of the second input signal. This signal, corresponding to the preselected fraction of the load voltage input signal, is conducted to a current-to-frequency converter which consequently controls a counting device. The count stored in the counting device, therefore, corresponds to the energy consumption of the load.

In order to apply the energy measuring system of German Patent reference DE-OS No. 2747 385 to multiphase systems, the system described hereinabove with respect to a single phase transmission system must be replicated for each phase of interest. Such replication, however, is complex and expensive because each analog switch must be shunted by the amplification circuitry.

In view of the foregoing, it is an object of this invention to produce a multiphase watt-hour meter which is simpler, less costly and requires less space than the replication of a single phase system.

SUMMARY OF THE INVENTION

The foregoing and other objects are achieved by this invention which provides a circuit having a duty cycle modulator and an analog switch associated with each phase of a multiphase system, the analog switch being responsive to an output signal of the duty cycle modulator for processing signals corresponding to the voltage and current associated with each phase conductor of the multiphase transmission system.

Such processing produces an output signal for each phase of interest which corresponds to the electrical power being conducted by the respectively associated phase conductor to the load. The plural output signals in a multiphase system are combined and conducted to a current-to-frequency converter. The frequency converter is coupled at its output to an accumulating counter, the number in which corresponds to the total energy supplied to the load. The invention eliminates the need for amplification circuitry and associated resistors in shunt with each analog switch. In an illustrative embodiment wherein the transmission system is of the three-phase type, the elimination of the shunt amplification circuitry produces a savings of at least three operational amplifiers and nine resistors. Moreover, the elimination of such components reduces the possibility of circuit failure. Such an elimination of the shunt components results from the realization that, in a transmission system having symmetrical phase voltages, the sum of the currents flowing in the three shunt branches equals zero.

In a preferred embodiment, the input signals corresponding to the load current are taken across measurement resistors which are serially disposed in each phase supply. It is, therefore, a feature of this invention that expensive and bulky current transformers and voltage transformers, which are required in known systems, can be eliminated.

BRIEF DESCRIPTION OF THE DRAWINGS

Comprehension of the invention is facilitated by reading the following detailed description in conjunction with the annexed drawings in which:

FIG. 2 is a guide showing the relationship between FIGS. 2a and 2b; and

FIGS. 2A and 2B are schematic representations of a three-phase watt-hour meter which operates in accordance with the principles of the invention.

DETAILED DESCRIPTION

Figure 1:
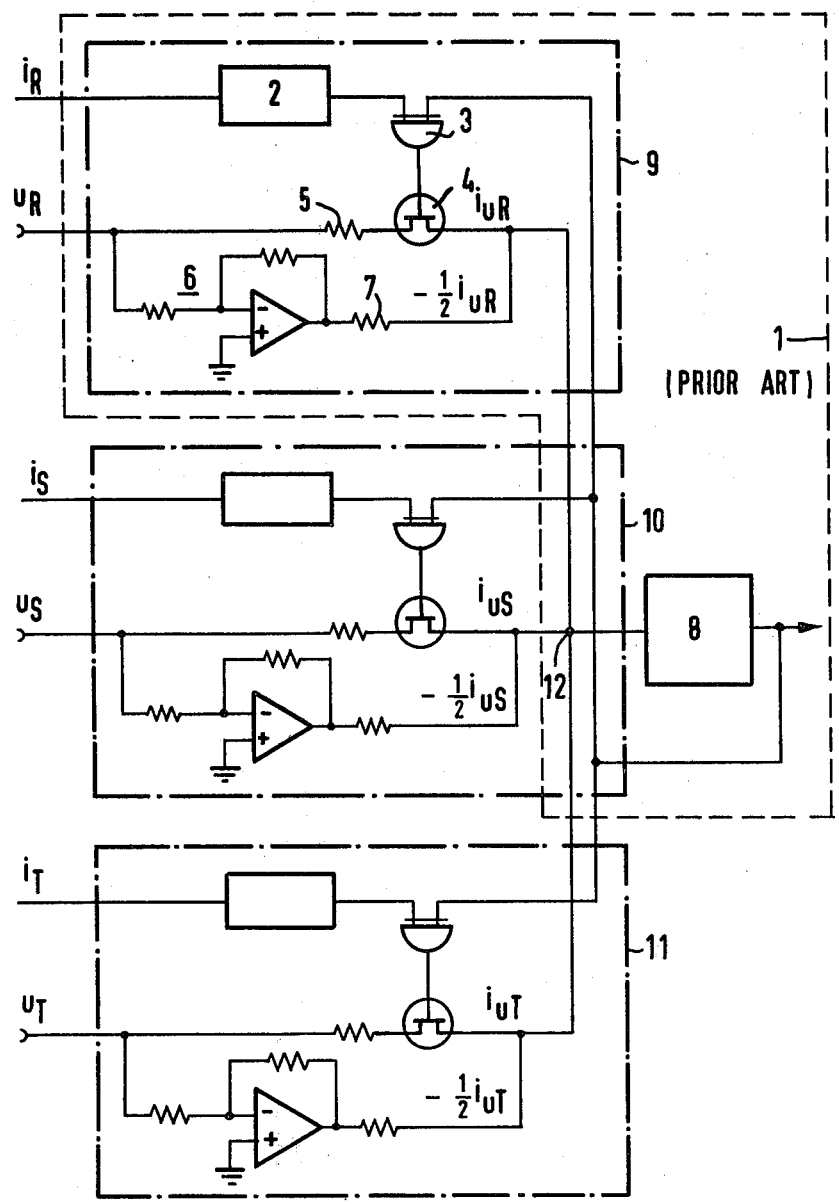
FIG. 1 shows prior art circuitry, partly in schematic form and partly in block and line representation, which has been replicated for each phase of interest to form a three-phase watt-hour metering system.

FIG. 1 shows an embodiment of a prior art watt-hour meter which is described in German Patent DE-OS No. 27 47 385 and which is useful for explaining the principles of the subject invention. An electronic single phase alternating current watt-hour meter system 1 is shown within a dashed line in the Figure. An input circuit 9, which is generally shown contained within a dashed and dotted line contains a duty cycle modulator 2 which receives at an input terminal a signal $i_R$ which is proportional to the load current flowing through a conductor of a transmission system (not shown). Duty cycle modulator 2 is connected at an output terminal to an input terminal of an exclusive OR gate 3 which is coupled at its output to a control terminal of an analog switch 4. Accordingly, analog switch 4 is placed into sequential conductive and non-conductive states which have a duty cycle relationship with respect to one another which corresponds to the output signal of duty cycle modulator 2. Analog switch 4 is coupled at an input terminal thereof to a terminal for receiving an input signal $u_R$ which is proportional to the load voltage, by means of a serial resistor 5. Thus, for any given value of load current signal $i_R$, analog switch 4 provides at an output terminal a current signal $i_{uR}$ which is proportional in amplitude to input load voltage signal $u_R$. The series circuit consisting of resistor 5 and analog switch 4 is shunted by a series circuit consisting of an inverting amplifier 6 which is coupled at its output to a serial resistor 7 and other feedback and input resistors, the value of which are preselected so as to produce an output current having a value negative $i_{uR}$ all divided by 2. The output current of analog switch 4 ($i_{uR}$) is combined with the current in the shunt loop ($-\frac{1}{2} \times i_{uR}$) to produce an output current which is conducted to a current-to-frequency converter 8, the current having a value of positive $\frac{1}{2} \times i_{uR}$ when analog switch 4 is in a conductive state, and $-\frac{1}{2} \times i_{uR}$ when analog switch 4 is non-conductive.

Current-to-frequency converter 8 comprises an integrator and a comparator which has two limits. When one limit of the comparator is reached, the comparator reverses the polarity of its output signal, and the resulting pulse-shaped signal activates an accumulating counting device (not shown), the number in which corresponds to the total energy consumption. The pulse-shaped signal at the output of current-to-frequency converter 8 is also conducted to a second input terminal of exclusive OR gate 3. The output signal of current-to-frequency converter 8 which is conducted to exclusive OR gate 3 corresponds to the inverted signal of duty cycle modulator 2, thereby causing the integrator in the current-to-frequency converter 8 to change direction of integration. As the integrator approaches a second limit of the comparator, the output signal of the comparator is reversed again. This operation causes the integrator to be sequentially charged and discharged. The output frequency of the current-to-frequency converter is proportional to the product of the load-current proportional input signal $i_R$, and the load-voltage proportional input signal $u_R$.

An electronic three-phase watt-hour meter which is commercially available and which operates according to the principle explained above with respect to single phase watt-hour meter system 1 is shown schematically in FIG. 1. Each of the three transmission system phases R, S and T are assigned to a respective one of input circuits 9, 10 and 11. Input circuits 10 and 11 are but replications of input circuit 9 described hereinabove and in German Patent reference DE-OS No. 27 47 385. Thus, each such input circuit comprises a duty cycle modulator, an analog switch and amplification circuitry connected in shunt across the analog switch. The output signals of the input circuits 9, 10 and 11 are combined at a point 12 and conducted to the commonly shared current-to-frequency converter 8. As is the case with the hereinabove described single phase watt-hour meter system 1, current-to-frequency converter 8 is connected at its output to an accumulating device (not shown) for determining the energy consumption.

Figure 2B:
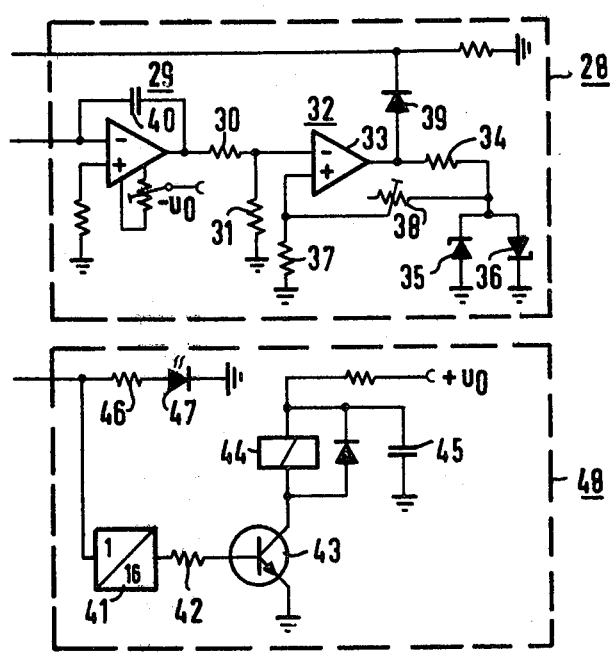

FIGS. 2A and 2B show a multiphase watt-hour metering system which operates in accordance with the principles of the invention to measure the total energy delivered to a load by a transmission network having phase conductors R, S and T. A neutral conductor O is shown as part of the transmission system, but is not connected to the watt-hour meter system. As shown in FIG. 2A, input circuits 101, 201 and 301, are each associated with a respective one of phase conductors R, S and T. Input circuit 101 which is associated with phase conductor R contains circuit components identified by reference numerals in a 100 series; input circuit 201 which is associated with a phase conductor S contains circuit components which are designated with reference numerals in a 200 series; and input circuit 301 which is associated with phase conductor T has circuit components which are designated with reference numerals in a 300 series. Since input circuits 101, 201 and 301 are identical to one another in design and operation, the descriptions hereinbelow pertaining to input circuit 101 should be construed to be applicable to all input circuits.

Phase conductors R, S and T each have serially disposed therein a respective one of low resistance measuring resistors 100, 200 and 300. Input circuit 101 is coupled by serial resistor 102 to the load side of measuring resistor 100 so as to provide at an inverting input terminal of a preamplifier 106 an input signal $i_R$ which corresponds to the load current. Diode 103 and 104 which serve for overvoltage protection are connected in parallel, but poled for forward conduction in opposite directions, between the inverting input terminal of preamplifier 106 and a reference potential which is obtained at the transmission network side of measuring resistor 100. The potential at the transmission network side of measuring resistor 100 also serves as a reference potential for a duty cycle modulator 105.

Duty cycle modulator 105 receives load current input signal $i_R$, as indicated, at the inverting input terminal of a preamplifier 106, which is constructed with an operational amplifier. Preamplifier 106 is coupled at its output to an inverting input terminal of an astable multivibrator 108, by means of a serial resistor 107.

The duty cycle of astable multivibrator 108 is a function of the magnitude of load current input signal $i_R$. The astable multivibrator comprises an operational amplifier 109 which has its output terminal coupled to its inverting input terminal by a feedback resistor 110. A capacitor 111 is connected between the inverting input of operational amplifier 109 and the reference potential of the phase conductor R at line 112. A non-inverting input terminal of operational amplifier 109 is connected to line 112 by a resistor 113. The output signal of operational amplfier 109 is coupled to the non-inverting input terminal by a feedback resistor 114. The output terminal of operational amplifier 109 is further coupled to the reference potential at line 112 by the parallel combination of reference diodes 115 and 116, which are poled for forward conduction in opposite directions.

The output signal of astable multivibrator 108, which is also the output signal of duty cycle modulator 105, is conducted by a resistor 117 to an optical coupler 118 which operates to isolate the reference potential from ground. A diode 119 is connected in parallel to the light emitting diode of optical coupler 118, but is poled for forward conduction in an opposite direction. Diode 119 insures that currents can flow through reference diode 116 if the output signal of operational amplifier 109 is inverted. Although duty cycle modulator 105 is referenced in potential to the voltage at phase conductor R, the duty cycle is converted by optical coupler 118 so as to be referenced to ground. In operation, the current from the output of operational amplifier 109 which flows through the light emitting diode of optical coupler 118 is also conducted through reference diode 115. This provides the advantage of minimizing the supply current drain by duty cycle modulator 105.

The output signal of optical coupler 118 is conducted to an input terminal of an exclusive OR gate 120. Exclusive OR gate 120 is coupled at its output to a control terminal of a field effect transistor 122 which operates as an analog switch. The combination of exclusive OR gate 120, analog switch 122 and duty cycle modulator 105 operates as a time-division multiplier which is assigned to the transmission network phase on phase conductor R. Similarly, the time-division multiplier assigned to phase S consists of duty cycle modulator 205, an exclusive OR gate, and an analog switch 222; and the time-division multiplier assigned to phase T consists of a duty cycle modulator 305, an exclusive OR gate 320, and an analog switch 322.

Analog switch 122 in input circuit 101 chops the voltage-proportional input current signal $i_{uR}$ in accordance with the duty cycle which is determined by the duty cycle modulator 105. Diodes 124 and 125, which are connected in parallel and poled for conduction in opposite directions, are connected between the input terminal of analog switch 122 and ground. These diodes serve to limit the amplitude of the signal applied to the input of analog switch 122. The output signal of analog switch 122 on line 126 is a time-division multiplication signal which is power-proportional to the signal taken from phase conductor R. The output signals of analog switches 122, 222 and 322, are combined at a summing node 27.

It is evident from the foregoing that the input circuits shown in FIG. 2A do not contain a shunting branch across the respective analog switches, as mentioned in the embodiment of FIG. 1. As previously indicated, the omission of the shunting branches is enabled by the fact that the current through such branches would sum to zero at any instant, for a symmetrical three-phase system.

The combined output signals at node 27 are conducted to a commonly shared current-to-frequency converter 28. Current-to-frequency converter 28 contains an integrator 29 which is constructed with an operational amplifier having an output terminal which is coupled by a voltage divider circuit consisting of resistors 30 and 31 to an inverting input terminal of an operational amplifier 33 of a comparator 32. The output signal of comparator 32 is connected to ground by a resistor 34 and the parallel combination of reference diodes 35 and 36 which are poled for conduction in opposite directions. A non-inverting input of operational amplifier 33 is connected to ground by a resistor 37 and to reference diodes 35 and 36 by a variable resistor 38. Variable resistor 38 is advantageously adjustable to preselect two threshold limits of comparator 32. Additionally, such limits can be modified by the advantageous selection of reference diodes 35 and 36.

The output signal of comparator 32 at the output terminal of operational amplifier 33 is conducted by a diode 39 to input terminals of exclusive OR gates 120, 220 and 320 which are contained in respective input circuits 101, 201 and 301. Diode 39 suppresses the negative signal component of operational amplifier 33. In a first state of the output signal of comparator 32, analog switches 122, 222 and 322 are activated in response to the output signals of duty cycle modulators 105, 205 and 305 so as to produce at summing node 27, a current which is proportional to the sum of the powers of the transmission network phases at phase conductors R, S and T. This produces a slow charging of an integration capacitor 40 in integrator 29 until the output signal of integrator 29 reaches a first limit of comparator 32. At that moment, comparator 32 changes the state of its output signal. Thereby permitting only the inverted output signals of the duty cycle modulators 105, 205 and 305 to drive the analog switches. This produces a power-proportional current responsive to the three phases at summing node 27, but with a reverse polarity. Consequently, integration capacitor 40 slowly discharges until a second limit of comparator 32 is reached, whereupon the output signal once again reverses its state. The frequency of the changes in signal at the output of comparator 32 is proportional to the total power taken from the transmission network by means of phase conductors R, S and T.

A summation of the signal changes at the output of comparator 32 over a given period of time corresponds to the energy drawn from the transmission network during the same time interval. In this embodiment of the invention, the output signal of comparator 32 is conducted to a frequency divider 41 in an accumulating counting system 48. Frequency divider 41 is coupled at its output to the base terminal of a switching transistor 43 by means of a resistor 42. Switching transistor 43 switches a pulse relay 44 which is supplied by parallel capacitor 45. Capacitor 45 is connected between a positive supply voltage $u_O$ and ground. Frequency divider 41 steps down the output frequency of comparator 32 by a predetermined fraction, because the frequency of the comparator is too high for operating electromechanical counting mechanisms. A light emitting diode 47 is connected by a resistor 46 to the output of comparator 32 and provides a visual indication of the signal changes of the comparator, and consequently, of the rate of power usage.

In the above described embodiment of the invention, load current-responsive and voltage-responsive input signals to the input circuits 101, 201 and 301, from respectively associated phase conductors R, S and T, are obtained by direct connection to the phase conductors across respective measuring resistors 100, 200 and 300. It is to be understood, however, that the principles of the inventions are applicable to systems wherein such input signals are obtained from current and voltage transformers. It should further be noted that although the hereinabove described embodiment of the invention conducts a voltage responsive signal to an analog switch, and a current responsive signal to a duty cycle modulator, such inputs signals may be interchanged so as to provide the voltage proportional input signal to the duty cycle modulator and the load current proportional input signal to the time-division multiplier containing the analog switch. Thus, it is to be understood that although the inventive concept disclosed herein has been described in terms of specific embodiments and applications, other applications and embodiments will be obvious to persons skilled in the pertinent art without departing from the scope of the invention. The drawings and descriptions of specific embodiments of the invention in this disclosure are illustrative of applications of the invention and should not be construed to limit the scope thereof.

What is claimed is:

1. A circuit for measuring, by time-division multiplication, electrical energy which is delivered to a load by a multiphase transmission system having n symmetrical phases, the circuit being characterized in that there are provided:

n means for producing n respective first signals, each of said first signals being responsive to a voltage at a respectively associated phase conductor of the multiphase transmission system;

n means for producing n respective second signals, each of said second signals being responsive to a load current flowing through a respectively associated phase conductor of the multiphase transmission system;

n switching means, each having first, second and control terminals, said first terminal being adapted to receive a respectively associated one of said first signals;

n duty cycle modulator means each having an input terminal for receiving a respectively associated one of said second signals and an output terminal for providing an output signal having a duty cycle responsive to the amplitude of said respectively associated second signal;

n means for coupling said output signal of a respectively associated duty cycle modulator means to said control terminal of a respectively associated one of said switching means for controlling said associated switching means in response to said output signal and thereby producing at said second terminal of said respectively associated switching means a respective time-division multiplied, energy proportional signal;

combining means connected to each of said second terminals of said n switching means for producing a composite multiplier signal responsive to said n time-division multiplied, energy proportional signals at said n second terminals of said n switching means;

current-to-frequency conversion means having an input terminal connected to said combining means for receiving said composite multiplier signal, and an output terminal for providing an output frequency signal responsive to said composite multiplier signal; and counting means having an input terminal connected to said output terminal of said current-to-frequency conversion means for receiving said output frequency signal, and producing an indication responsive to said output frequency signal.

2. The circuit of claim 1 wherein there is further provided:

n measurement resistor means each disposed in a respectively associated one of n phase conductors of the multiphase transmission system, each of said measurement resistor means being disposed in said respectively associated phase conductor so as to have a transmission system side and a load side, a respectively associated one of said means for producing first signals being connected at said transmission system side, and a respectively associated one of said means for producing second signals being connected at said load side.

3. The circuit of claim 1 wherein each of said n means for coupling comprises an exclusive OR gate having a first input terminal for coupling to said output terminal of said respectively associate duty cycle modulator means, a second input terminal for coupling to said output terminal of said current-to-frequency conversion means, and an output terminal for coupling to said control terminal of said respectively associated switching means.

4. The circuit of claim 1 wherein a respective one of said second signals is coupled to said first terminal of said respectively associated switching means.

5. The circuit of claim 2 wherein a potential on said transmission system side of each of said n measuring resistor means is a reference potential for a respectively associated one of said n duty cycle modulator means.

6. The circuit of claim 3 wherein each of said n means for coupling further comprises potential isolating means between said output terminal of said respectively associated duty cycle modulator means and said first input terminal of said respectively associated exclusive OR gate.

7. The circuit of claim 1 wherein said current-to-frequency conversion comprises:

integrator means having an input terminal connected to said input terminal of said current-to-frequency conversion means, and an output terminal for producing a signal responsive to said composite multiplier signal; and comparator means having an input terminal connected to said output terminal of said integrator means, and an output terminal for producing said output frequency signal, said output frequency signal being responsive to first and second threshold limits in said comparator means.

8. The circuit of claims 1 or 7 wherein said counting means further comprises:

frequency divider means having an input terminal for receiving said output frequency signal and an output terminal; and electronic switching means for controlling an electromechanical counting mechanism in response to a signal at said output terminal of said frequency divider means.

* * * * *